United States Patent
Lee et al.

(10) Patent No.: US 10,481,208 B2
(45) Date of Patent: Nov. 19, 2019

(54) METHOD FOR WELDING ELECTRODE LEADS OF SECONDARY BATTERY MODULE AND COMPACT SECONDARY BATTERY MODULE USING THE SAME

(71) Applicant: LG CHEM, LTD., Seoul (KR)

(72) Inventors: Bum-Hyun Lee, Daejeon (KR); Jin-Kyu Shin, Daejeon (KR); Seang-Hee Chae, Daejeon (KR)

(73) Assignee: LG CHEM, LTD., Seoul (KR)

( * ) Notice: Subject to any disclaimer, the term of this patent is extended or adjusted under 35 U.S.C. 154(b) by 94 days.

(21) Appl. No.: 15/533,165

(22) PCT Filed: Dec. 24, 2015

(86) PCT No.: PCT/KR2015/014281
§ 371 (c)(1),
(2) Date: Jun. 5, 2017

(87) PCT Pub. No.: WO2016/105168
PCT Pub. Date: Jun. 30, 2016

(65) Prior Publication Data
US 2017/0343615 A1 Nov. 30, 2017

(30) Foreign Application Priority Data
Dec. 24, 2014 (KR) .................. 10-2014-0188072

(51) Int. Cl.
*H01M 2/10* (2006.01)
*H01M 2/20* (2006.01)
(Continued)

(52) U.S. Cl.
CPC ............ *G01R 31/364* (2019.01); *H01M 2/10* (2013.01); *H01M 2/1011* (2013.01);
(Continued)

(58) Field of Classification Search
None
See application file for complete search history.

(56) References Cited

U.S. PATENT DOCUMENTS

| | | |
|---|---|---|
| 2011/0059342 A1 | 3/2011 | Lee et al. |
| 2013/0130071 A1 | 5/2013 | Adachi et al. |

(Continued)

FOREIGN PATENT DOCUMENTS

| | | |
|---|---|---|
| JP | 2013-229266 A | 11/2013 |
| JP | 2014-238938 A | 12/2014 |

(Continued)

OTHER PUBLICATIONS

International Search Report for PCT/KR2015/014281 (PCT/ISA/210) dated Apr. 11, 2016.

*Primary Examiner* — Jonathan Crepeau
(74) *Attorney, Agent, or Firm* — Birch, Stewart, Kolasch & Birch, LLP (57) ABSTRACT

Disclosed is a compact secondary battery module, which includes a cartridge assembly having a plurality of cartridges stacked while accommodating cells, respectively, so that a plurality of lead welding portions where a first lead and a second lead of adjacent cells overlap with each other are located at a cartridge sidewall with a predetermined pattern; and a sensing housing having a plurality of bus bars located and welded corresponding to the lead welding portions, respectively, the sensing housing being capable of being arranged at a side of the cartridge assembly, wherein when the sensing housing is coupled to the cartridge assembly, the first lead, the second lead and the bus bar are located in order from the sidewall of the cartridge in an outer direction and welded from the bus bar.

18 Claims, 7 Drawing Sheets

(51) Int. Cl.
  *H01M 10/48*  (2006.01)
  *G01R 31/364*  (2019.01)
  *H01M 2/30*  (2006.01)
  *H01M 2/22*  (2006.01)
  *H01M 2/34*  (2006.01)
  *H01M 10/46*  (2006.01)

(52) U.S. Cl.
  CPC ........... *H01M 2/1077* (2013.01); *H01M 2/20* (2013.01); *H01M 2/202* (2013.01); *H01M 2/206* (2013.01); *H01M 2/22* (2013.01); *H01M 2/30* (2013.01); *H01M 2/34* (2013.01); *H01M 10/46* (2013.01); *H01M 10/48* (2013.01); *H01M 10/482* (2013.01); *H01M 10/486* (2013.01); *Y02E 60/12* (2013.01)

(56) References Cited

U.S. PATENT DOCUMENTS

| | | |
|---|---|---|
| 2015/0194708 A1 | 7/2015 | Kim |
| 2016/0056427 A1 | 2/2016 | Kim et al. |
| 2017/0162841 A1* | 6/2017 | Lee ........................ H02S 40/38 |

FOREIGN PATENT DOCUMENTS

| | | | |
|---|---|---|---|
| KR | 10-2009-0093222 A | | 9/2009 |
| KR | 10-2010-0109857 A | | 10/2010 |
| KR | 10-2013-0076499 A | | 7/2013 |
| KR | 10-2013-0108691 A | | 10/2013 |
| KR | 10-2014-0056836 A | | 5/2014 |
| KR | 10-2015-0062777 | * | 6/2015 |
| WO | WO 2013/191478 A1 | | 12/2013 |
| WO | WO 2014/185567 A1 | | 11/2014 |

* cited by examiner

METHOD FOR WELDING ELECTRODE LEADS OF SECONDARY BATTERY MODULE AND COMPACT SECONDARY BATTERY MODULE USING THE SAME

TECHNICAL FIELD

The present disclosure relates to a method for welding electrode leads of a secondary battery module and a compact secondary battery module using the same, and more particularly, to a method for welding electrode leads and bus bars of a lithium secondary battery module and a lithium secondary battery module using the same.

The present application claims priority to Korean Patent Application No. 10-2014-0188072 filed on Dec. 24, 2014 in the Republic of Korea, the disclosures of which are incorporated herein by reference.

BACKGROUND ART

Along with technical development and increased demands on mobile devices, secondary batteries have been consumed more and more as energy sources. In the past, nickel cadmium batteries or hydrogen ion batteries have been used as secondary batteries, but recently, lithium ion batteries and lithium polymer batteries with a high energy density are widely used.

Among these secondary batteries, a lithium secondary battery using lithium transition metal oxide, lithium complex oxide or the like as a positive electrode active material and ensuring high output and capacity receives a great interest. Generally, a lithium secondary battery has a structure in which an electrode assembly composed of a positive electrode, a separator and a negative electrode is embedded in a sealed container together with an electrolyte.

Meanwhile, the lithium secondary battery includes a positive electrode, a negative electrode, and a separator and an electrolyte interposed therebetween. Depending on which material is used as a positive electrode active material and a negative electrode active material, the lithium secondary battery is classified into a lithium ion battery (LIB), a polymer lithium ion battery (PLIB) and so on. Typically, electrodes of these lithium secondary batteries are formed by applying a positive electrode active material or a negative electrode active material to a current collector such as aluminum or copper sheet, mesh, film, or foil, and then drying the same.

In the secondary battery module, cells accommodated in each cartridge by performing welding, bolting, riveting or the like between cell leads. In addition, when cells are arranged in series or in parallel in the secondary battery module, three members, namely the positive electrode lead made of aluminum, the negative electrode lead made of copper and the bus bar made of copper and disposed for sensing should be electrically connected by using the above method.

According to the prior art, there are various secondary battery modules, and the cartridges of the modules and bus bars for sensing are structured and located in different ways. For this reason, it is difficult to efficiently perform the connection work and the welding quality of the sensing structure is deteriorated. In addition, an unnecessary space of the secondary battery module should be provided for welding or the like, and resultantly energy density of the secondary battery module is lowered.

In addition secondary battery modules used in energy storage devices or power storage devices have been developed for designing developing secondary battery modules as compact as possible in order to increase energy efficiency or density.

Meanwhile, in the configuration of a general secondary battery module, when welding (especially, laser welding) is performed to electrode leads (Al)(Cu) and bus bars (Cu) of cells, due to the different melting points of materials, generally, base materials are disposed in the order of an aluminum lead, a copper lead and bus bars, and then laser is irradiated from a cell lead for welding. However, if welding is performed in this order, the cell lead may be deformed first by the laser.

DISCLOSURE

Technical Problem

The present disclosure is designed to solve the problems of the related art, and therefore the present disclosure is directed to providing a method for welding electrode leads of a secondary battery module with an improved structure, in which a bus bar made of copper, a copper lead made of the same material as the bus bar, and an aluminum lead are arranged in order at a portion where corresponding electrode leads of adjacent cells of the secondary battery module and then integrally welded, or in which an aluminum lead a copper lead are arranged in parallel and then welded at two welding point from the bus bar. The present disclosure is also directed to providing a compact secondary battery module using the method.

Technical Solution

In one aspect of the present disclosure, there is provided a compact secondary battery module, comprising: a cartridge assembly having a plurality of cartridges stacked while accommodating cells, respectively, so that a plurality of lead welding portions where a first lead and a second lead of adjacent cells overlap with each other are located at a cartridge sidewall with a predetermined pattern; and a sensing housing having a plurality of bus bars located and welded corresponding to the lead welding portions, respectively, the sensing housing being capable of being arranged at a side of the cartridge assembly, wherein when the sensing housing is coupled to the cartridge assembly, the first lead, the second lead and the bus bar are located in order from the sidewall of the cartridge in an outer direction and welded from the bus bar.

In another aspect of the present disclosure, there is also provided a compact secondary battery module, comprising: a cartridge assembly having a plurality of cartridges stacked while accommodating cells, respectively, so that a plurality of lead welding portions where leads of adjacent cells are located on substantially the same line are formed at a cartridge sidewall with a predetermined pattern; and a sensing housing having a plurality of bus bars located and welded corresponding to the lead welding portions, respectively, the sensing housing being capable of being arranged at a side of the cartridge assembly, wherein when the sensing housing is coupled to the cartridge assembly, the bus bars are welded to a first lead and a second lead having a polarity opposite to the first lead of corresponding cells at different welding points.

Preferably, the secondary battery module may further comprise a barrier provided at a side of each cartridge to protect the cell during a welding work.

Preferably, the lead of each cell may be bent at a right angle at about 1 mm from a lead insulation portion in a state of being accommodated in the corresponding cartridge.

Preferably, the welding may be laser welding.

Preferably, in the laser welding, laser may be irradiated substantially perpendicular to the sensing housing.

Preferably, the bus bar and the second lead may be made of copper, and the first lead may be made of aluminum.

Preferably, the sensing housing may further include a battery management system (BMS) circuit board configured to manage voltage and/or temperature data of each cell detected by each bus bar.

Preferably, the sensing housing may be coupled to the cartridge assembly by means of snap-fitting or hooking.

Preferably, the secondary battery module may further comprise a sensing cover coupled to the sensing housing.

Preferably, the sensing cover may be coupled to the sensing housing by means of snap-fitting or hooking.

Preferably, two neighboring cartridges of the cartridge assembly may be coupled to each other by means of hooking.

Preferably, the cartridge assembly may further include an upper cover and a lower cover coupled to cartridges at both ends thereof by means of hooking.

In another aspect of the present disclosure, there is also provided a method for welding electrode leads of a compact secondary battery module, comprising: (a) preparing a plurality of cells having a first lead and a second lead which have opposite polarities and are bent in opposite directions; (b) forming a cartridge assembly by stacking a plurality of cartridges accommodating cells, respectively, so that lead welding portions are formed at a cartridge sidewall with a predetermined pattern, the lead welding portions allowing the first lead of any one of adjacent cells to face the cartridge sidewall and allowing the second lead of the other cell to face the first lead; (c) assembling a sensing housing having a plurality of bus bars respectively facing the second lead to a side of the cartridge assembly; and (d) welding each bus bar as well as the second lead and the first lead corresponding thereto.

In another aspect of the present disclosure, there is also provided a method for welding electrode leads of a compact secondary battery module, comprising: (a) preparing a plurality of cells having a first lead and a second lead which have opposite polarities and are bent in opposite directions; (b) forming a cartridge assembly by stacking a plurality of cartridges accommodating cells, respectively, so that lead welding portions are formed at a cartridge sidewall, the lead welding portions allowing the first lead of any one of adjacent cells and the second lead of the other cell to be located on the same line at the cartridge sidewall; (c) assembling a sensing housing having a plurality of bus bars capable of facing the first and second corresponding leads at the same time to a side of the cartridge assembly; and (d) welding the bus bars at different welding points corresponding to the first lead and the second lead.

Preferably, in the step (b), a barrier may be formed at a side of each cartridge.

Preferably, in the step (a), each lead may be bent at a right angle at about 1 mm from a lead insulation portion of the cell in a state of being accommodated in the corresponding cartridge.

Preferably, the step (d) may use a laser welder.

Preferably, a laser irradiation direction of the laser welder may be substantially perpendicular to the sensing housing.

Preferably, the bus bar and the second lead may be made of copper, and the first lead may be made of aluminum.

In another aspect of the present disclosure, there is also provided a compact secondary battery module, manufactured by the above method.

In another aspect of the present disclosure, there is also provided a secondary battery packing, comprising the compact secondary battery module manufactured by the above method.

Advantageous Effects

The method for welding electrode terminals of a compact secondary battery module and the compact secondary battery module using the same according to embodiments of the present disclosure give the following effects.

First, a bending length of the lead of the cell is minimized, and while assembling a structure to which the bus bar is attached is assembled to a side of the cartridge assembly, the order of base materials may be changed (for example, welding is individually performed at two welding points between the bus bar and the aluminum lead and between the bus bar and the copper lead, or the bus bar, the copper lead and the aluminum lead are welded at the same time), especially in laser welding. In other words, it is possible to improve the welding quality of the sensing structure and to construct a compact module by welding different kinds of materials.

Second, an unnecessary space is minimized in the module configuration, so that the module may be compactly constructed to improve the energy efficiency.

Third, it is possible to prevent the damage of the lead by irradiating laser to the bus bar first in a welding irradiation direction, in the order of the welding base material between the cell leads and the bus bar.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Figure 1:
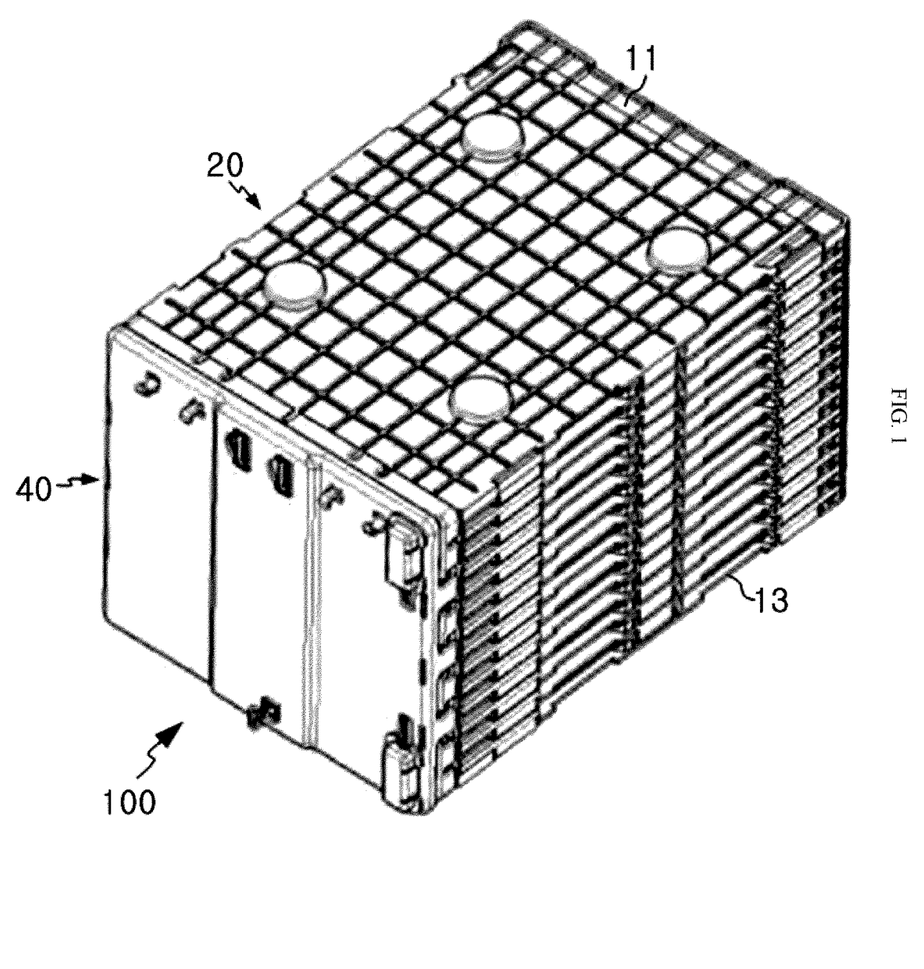
FIG. 1 is a perspective view showing a secondary battery module according to an embodiment of the present disclosure.
Figure 2:
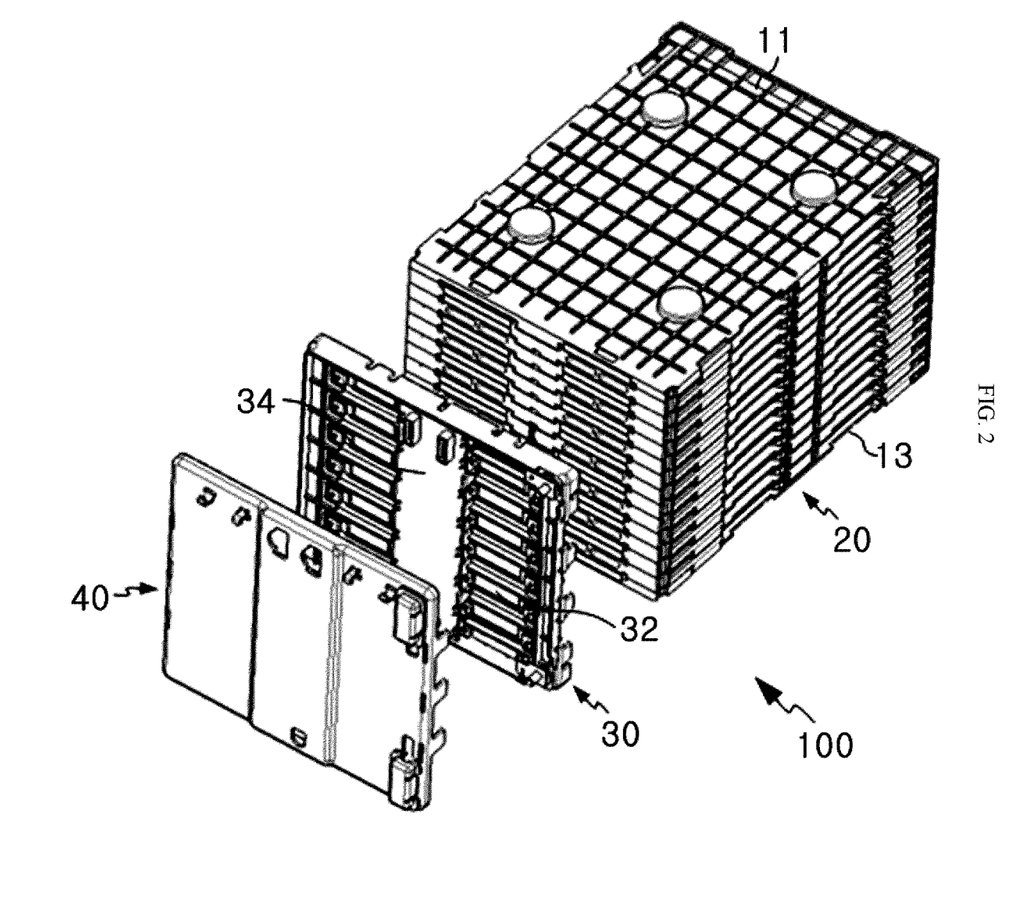
FIG. 2 is an exploded perspective view showing the secondary battery module according to an embodiment of the present disclosure.

FIG. 1 is a perspective view showing a secondary battery module according to an embodiment of the present disclosure, and FIG. 2 is an exploded perspective view showing the secondary battery module according to an embodiment of the present disclosure.

Referring to FIGS. 1 and 2, a compact secondary battery module 100 according to an embodiment of the present disclosure includes a cartridge assembly 20 in which a plurality of cartridges 10 accommodating cells 2, respectively, are stacked, a sensing housing 30 coupled to a side of the cartridge assembly 20 by means of, for example, one-touch, snap-fitting, hooking or the like, and a sensing cover 40 for protecting a plurality of bus bars 32 and a battery management system (BMS) circuit board 34 installed at the sensing housing 30. In FIG. 2, a reference sign 36 represents a pair of data communication ports for exchanging data between BMS circuit boards 34 when a plurality of modules 100 are coupled, and a reference sign 38 represents a temperature data port for receiving a signal of a temperature sensor (not shown) which measures an inner temperature of the secondary battery module 100. A reference sign 31 represents a positive electrode terminal and a negative electrode terminal of a complete secondary battery module 100, respectively.

The cartridge assembly 20 is prepared by stacking a plurality of cartridges 10 which are made by injection-molding plastic and respectively have an accommodation portion capable of accommodating the cell 2. The cartridges 10 may be coupled to each other by means of snap-fitting or hooking. In the cartridge assembly 20, a plurality of lead welding portions where leads 12, 14 having opposite polarities of neighboring cells 2, for example a first lead 12 made of aluminum and having a first polarity and a second lead 14 made of copper and having a second polarity opposite to the first polarity, overlap each other are located at the sidewall of each cartridge 10 with a predetermined pattern.

The cartridge assembly 20 has an upper cover 11 and a lower cover 13, coupled to the cartridges 10 at both ends by means of, for example, hooking. The upper cover 11 and the lower cover 13 are injection-molded to have substantially the same shape as the individual cartridge 10 of the cartridge assembly 20, respectively. It will be understood by those skilled in the art that the upper cover 11 and the lower cover 13 have a function of protecting the cell 2 accommodated in the cartridges 10 at both ends and have a function and structure to finish and surround the appearance of the secondary battery module 100.

Figure 3:
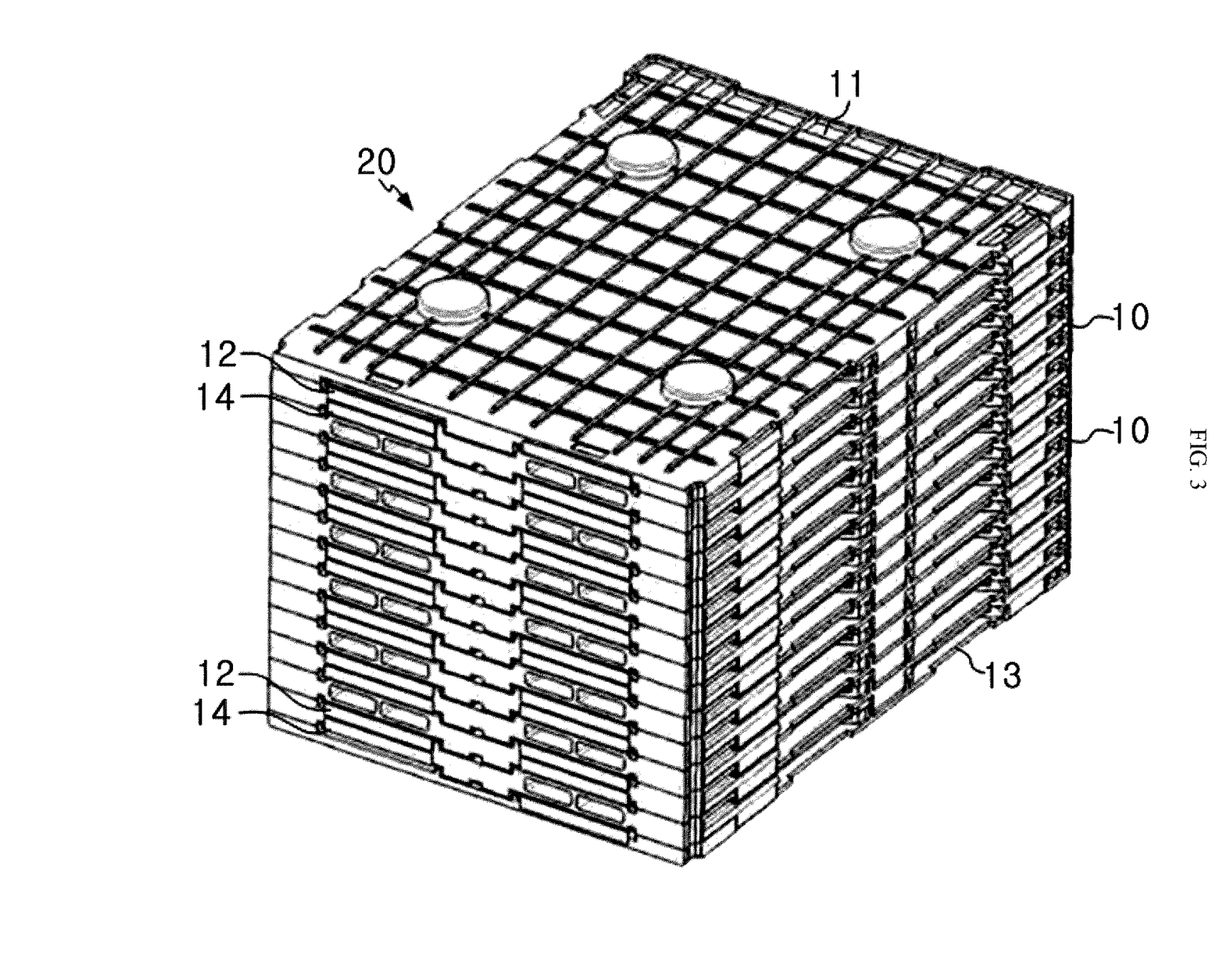
FIG. 3 is a partial perspective view showing a cartridge assembly depicted in FIGS. 1 and 2.
Figure 4:
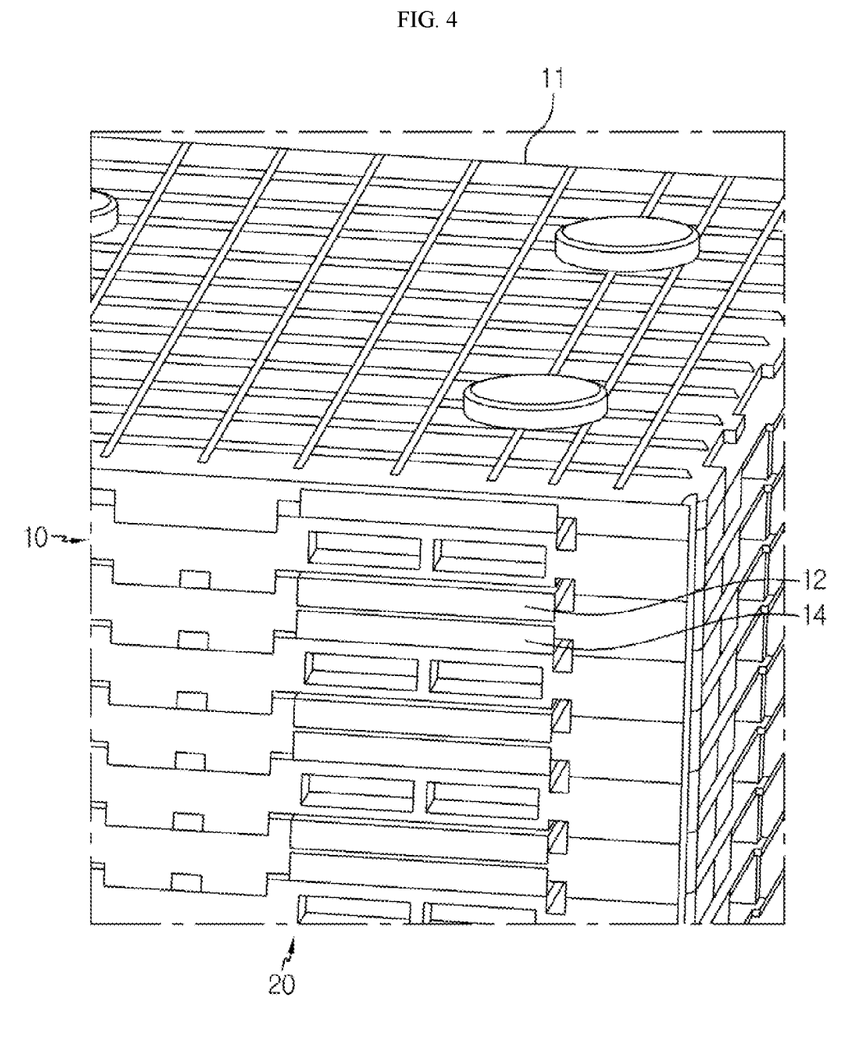
FIG. 4 is an enlarged perspective view of FIG. 3.
Figure 5:
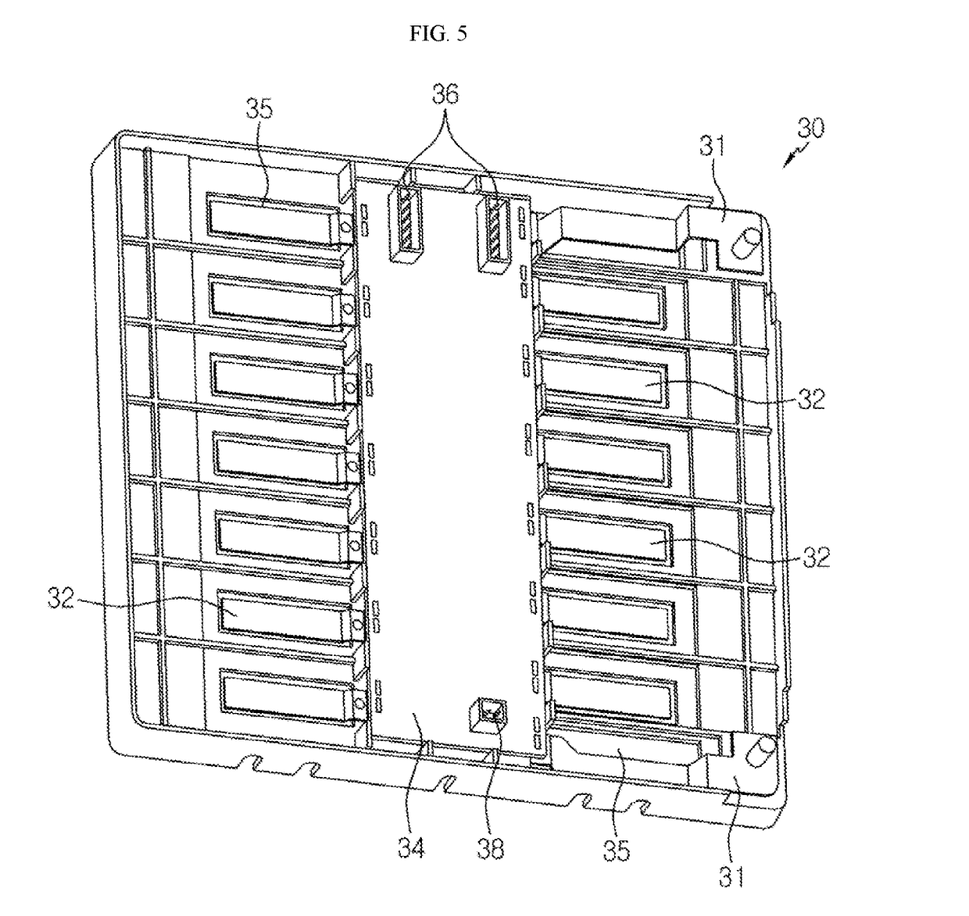
FIG. 5 is a partial perspective view showing a sensing housing of FIG. 2.

FIG. 3 is a partial perspective view showing a cartridge assembly depicted in FIGS. 1 and 2, FIG. 4 is an enlarged perspective view of FIG. 3, and FIG. 5 is a partial perspective view showing a sensing housing of FIG. 2.

Referring to FIGS. 1 to 5, the sensing housing 30 is provided with a plurality of bus bars 32 corresponding to the lead welding portions, respectively. Each bus bar 32 may be made of, for example, copper. In addition, the sensing housing 30 may be injection-molded in an approximately rectangular shape by, for example, insulating plastic, and a plurality of accommodation holes 35 capable of respectively accommodating the bus bars 32 are formed therethrough in a predetermined pattern. At an approximate center of the sensing housing 30, a BMS circuit board 34 functioning to collect voltage and/or temperature data of each cell 2 sensed by the corresponding bus bar 32, balancing the corresponding cell 2 by means of the collected data, and transferring the data to another controller (not shown) of the module is installed. The BMS circuit board 34 is electrically connected to one end of each bus bar 32.

The first lead 12 and the second lead 14 extend and bend from a side of each cell 2 by a predetermined length and have a predetermined width, respectively. The first lead 12 of each cell 2 is bent by 90 degrees downwards on the drawing, and the second lead 14 is bent 90 degrees upwards on the drawing.

As described above, in order to construct each lead welding portion, the first lead 12 of one of neighboring cells 2 extends from the bent portion by about a half of the thickness of the cartridge 10, and the second lead 14 of the other cell 2 extends by about another half of the thickness of the cartridge 10 so that the first lead 12 and the second lead 14 are positioned on the same plane in the lead welding portion and the ends thereof are substantially in contact with each other or spaced from each other by a predetermined distance. In this state, if the sensing housing 30 is coupled to the cartridge assembly 20, the bus bars 32 corresponding to each other face the first lead 12 and the second lead 14 at the same time. Also, for example, welding may be performed at two welding points using a laser welder. In this welding process, the bus bars 32 of the sensing housing 30 corresponding to the first leads 12 may be welded first, and then the welding points of the bus bars 32 corresponding to the second leads 14 may be welded. Also, two welding points may be welded simultaneously by using a welder with two welding points. According to a modified embodiment, it would be understood by those skilled in the art that the first lead 12, the second lead 14, and the bus bars 32 corresponding thereto may also be coupled together by ultrasonic welding.

Figure 6:
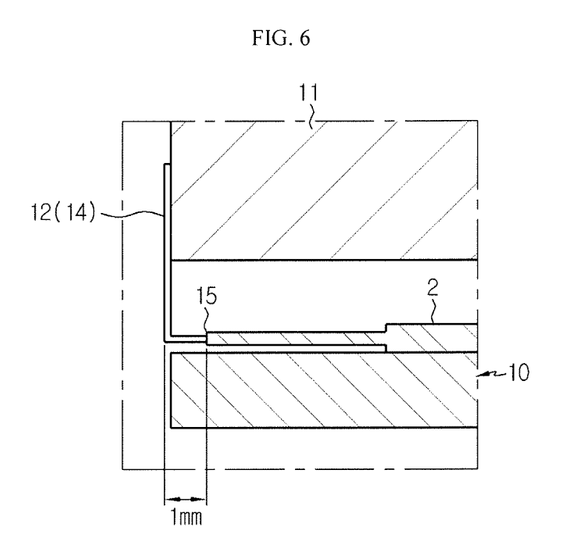
FIG. 6 is a cross-sectioned view showing a curved portion of a lead of a cell of the secondary battery module according to an embodiment of the present disclosure.

FIG. 6 is a cross-sectioned view showing a curved portion of a secondary battery module according to an embodiment of the present disclosure. Referring to FIG. 6, in order to maximize the energy efficiency by compactly configuring the secondary battery module 100 according to an embodiment of the present disclosure, the leads 12 14 of each cell 2 may be bent at a point of about 0.8 to 1.2 mm from the lead insulation portion 15 in a state of being accommodated in the corresponding cartridge.

Figure 7:
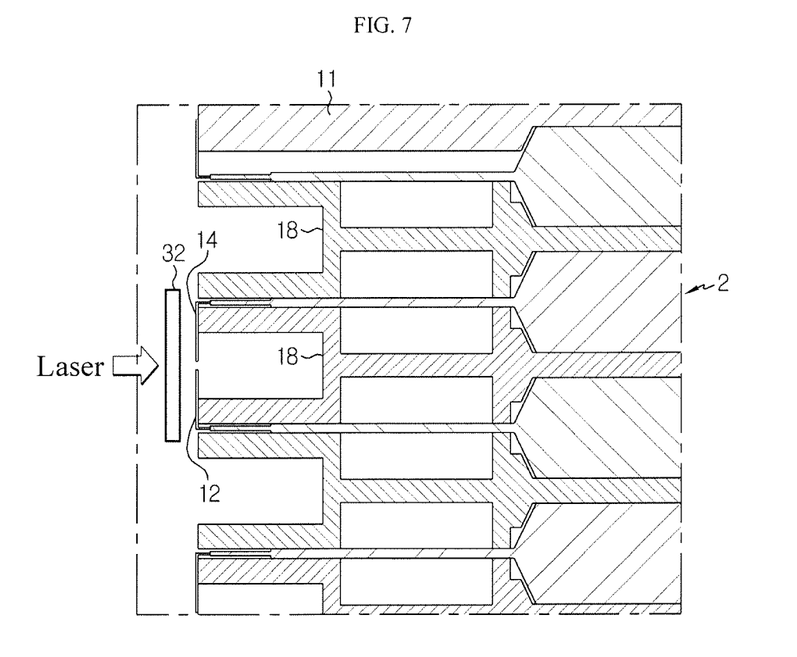
FIG. 7 is a partial cross-sectioned view showing a lead welding portion of the secondary battery module according to an embodiment of the present disclosure.

FIG. 7 is a partial cross-sectional view of a secondary battery module according to an embodiment of the present disclosure. Referring to FIG. 7, the sensing housing 30 is coupled to a side of the cartridge assembly 20 in a state where the first lead 12 and the second lead 14 of the cells 2 adjacent to the respective lead welding portions are disposed to face each other in parallel, thereby configuring the secondary battery module 100. In this case, the bus bar 32, the first lead 12 and the second lead 14 are positioned to face in a direction from the outside of the module 100, namely from a side where laser welding is performed, toward the cartridge assembly. In this arrangement, when welding is performed between the bus bar 32 and the first leads 12 and between the bus bar 32 and the second leads 14 in this deployed state, particularly when laser is irradiated in a direction substantially perpendicular to the sensing housing 30, each cartridge 10 has a barrier 18 on a side thereof in order to protect the cells 2 accommodated in each cartridge 10. It will be fully understood by those skilled in the art that the barrier 18 serves as a blocking wall to prevent a laser (not shown) emitting from a laser device (not shown) from being directly irradiated onto the cell 2.

Referring to FIGS. 1 and 2 again, in the secondary battery module 100 according to an embodiment of the present disclosure, in a state where the sensing housing 30 is coupled to the cartridge assembly 20, a sensing cover 40 is coupled to the sensing housing 30 to protect the BMS circuit board 34 and bus bar 32. The sensing cover 40 may be coupled to the sensing housing 30 by means of snap-fitting or hooking, and may also be injection-molded with an insulating plastic material.

A method of welding an electrode lead of a secondary battery module according to another embodiment of the present disclosure will be described.

Figure 8:
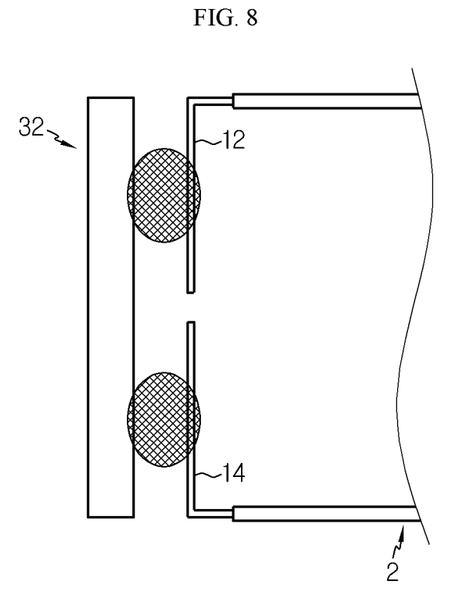
FIG. 8 is a diagram for illustrating a method for welding electrode leads of a compact secondary battery according to an embodiment of the present disclosure.

First, a plurality of cells 2 in which the first lead 12 and the second lead 14 having opposite polarities are bent in opposite directions are prepared. The lengths of the first lead 12 and the second lead 14 may be about a half of the width of cartridge 10 when the cell 2 is received in cartridge 10. In addition, in a state where the cell 2 is accommodated in the corresponding cartridge 10, the leads 12, 14 of the cell may be bent at a point of approximately 0.8 to 1.2 mm, preferably 1 mm, from the lead insulation portion 15 at a right angle, thereby maximizing the energy efficiency.

Subsequently, a plurality of cartridges 10 in which the cells 2 are respectively accommodated so that the lead welding portions are positioned in a predetermined pattern on the sidewall of the cartridges 10 to allow the leads 12, 14 of the neighboring cells 2 with opposite polarities to face each other are stacked to form the cartridge assembly 20. Here, if the cartridges 10 accommodating the cells 2 are stacked to form the cartridge assembly 20, ends of the first lead 12 and the second lead 14 of the neighboring two cells 2 with opposite polarities may contact each other or be spaced from each other by a predetermined distance. However, at the lead welding portion, the first lead 12 and the second lead 14 are placed on the same plane. Each cartridge 10 of the cartridge assembly 20 may include an accommodation portion capable of accommodating the cell 2, and may also have a hook or a slot so that a pair of adjacent cartridges 10 may be coupled to each other by means of snap-fitting or hooking, as being easily understood by those skilled in the art. In addition, at both sides of the cartridge assembly 20, the upper cover 11 and the lower cover 13 which may accommodate and protect the cell 2 are coupled to each other by means of, for example, snap-fitting or hooking. In addition, the cartridge 10 at which the first lead 12 and the second lead 14 are placed may employ a cartridge having a barrier 18 at a side thereof so that the cell 2 may be protected against the laser during the laser welding operation described below.

Next, the sensing housing 30 having a plurality of bus bars 32 respectively corresponding to respective lead welding portions is coupled to a side of the cartridge assembly 20 by means of snap-fitting or hooking so that the corresponding bus bar 32 may face the first lead 12 and the second lead 14. Here, the first lead 12 is made of aluminum, and the second lead 14 and the bus bar 32 are made of copper.

Finally, laser welding is performed at two welding points of the first lead 12, the second lead 14 and each bus bar 32 of each lead welding portion. In this step, a welding system with two welding points may be used for each bus bar 32, or a separate laser welder with a welding point corresponding to any one lead may be used to perform point welding several times. In addition, the laser welder may irradiate a laser in a direction substantially perpendicular to the sensing housing 30.

The secondary battery modules 100 according to the above embodiments may electrically connected to each other in series or in parallel and are accommodated in a predetermined case to provide a compact secondary battery pack for a power storage device for a home photovoltaic (PV) solar energy panel.

Figure 9:
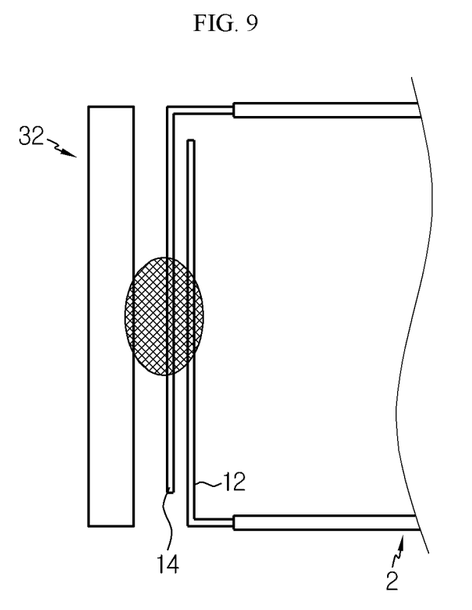
FIG. 9 is a diagram for illustrating a method for welding electrode leads of a compact secondary battery according to another embodiment of the present disclosure.

FIG. 9 is a diagram for illustrating a method for welding electrode leads of a compact secondary battery according to another embodiment of the present disclosure.

Referring to FIG. 9, in the secondary battery method for welding electrode leads of a secondary battery according to the present embodiment and the compact secondary battery module using the same, the first lead 12 and the second lead 14 of neighboring cells with opposite polarities are stacked to form a lead welding portion. In this process, the second lead 14 faces the sidewall of the cartridge 10, and the first lead 12 is positioned between the bus bar 32 and the second lead 14. In other words, by constructing, the lead welding portion in this way, for example, when the lead welding portion is welded using a laser welder, the bus bar 32, the first lead 12 and the second lead 14 may be positioned in order and welded at one point. In the welding method according to this embodiment, since three base materials should be welded at the same time, it is preferable to use a welder having a stronger output than the former embodiments using in which only two base materials are welded.

The foregoing description is merely illustrative of the technical features of the present disclosure, and various modifications and variations can be made by those having ordinary skill in the art without departing from the essential characteristics of the present disclosure. Therefore, the embodiments disclosed herein are not intended to limit but to illustrate the technical features of the present disclosure, and the scope of the technical features of the present disclosure is not limited by these embodiments. The scope of the present disclosure should be construed according to the appended claims, and all technical features falling within its equivalent scope should be construed as being included in the scope of the present disclosure.

INDUSTRIAL APPLICABILITY

The present disclosure relates to a method for welding electrode leads of a secondary battery module and a compact secondary battery module using the same, and is particularly applicable to industries related to welding of electrode leads of a secondary battery module.

What is claimed is:
1. A compact secondary battery module, comprising:
a plurality of cartridges configured to accommodate cells, respectively, the plurality of cartridges stacked in a first direction;
a first battery cell accommodated in a first cartridge of the plurality of cartridges, the first battery cell having a first lead extending from the first cartridge;
a second battery cell accommodated in a second cartridge of the plurality of cartridges, the second battery cell having a second lead extending from the second cartridge; and a sensing housing arranged at a side of a cartridge assembly in which the cartridges are stacked, the sensing housing having a plurality of bus bars, wherein corresponding electrode leads of adjacent cells are arranged to be coplanar in a first plane and one of the plurality of bus bars in a second plane overlaps the first lead and second lead and then is welded to the first lead and second lead at two welding points, the second plane being parallel to the first plane, and wherein the corresponding electrode leads of adjacent cells are spaced from one another in the first direction.

2. The compact secondary battery module according to claim 1, further comprising:

a barrier provided at a side of each cartridge to protect the cell during a welding work.

3. The compact secondary battery module according to claim 1, wherein the lead of each battery cell is bent at a right angle at about 1 mm from a lead insulation portion in a state of being accommodated in the corresponding cartridge.

4. The compact secondary battery module according to claim 1, wherein the welding is laser welding.

5. The compact secondary battery module according to claim 4, wherein in the laser welding, laser is irradiated substantially perpendicular to the sensing housing.

6. The compact secondary battery module according to claim 1, wherein the sensing housing further includes a battery management system (BMS) circuit board configured to manage voltage and/or temperature data of each cell detected by each bus bar.

7. The compact secondary battery module according to claim 6, wherein the sensing housing is coupled to the cartridge assembly by means of snap-fitting or hooking.

8. The compact secondary battery module according to claim 6, further comprising:

a sensing cover coupled to the sensing housing.

9. The compact secondary battery module according to claim 8, wherein the sensing cover is coupled to the sensing housing by means of snap-fitting or hooking.

10. The compact secondary battery module according to claim 1, wherein two neighboring cartridges of the cartridge assembly are coupled to each other by means of hooking.

11. The compact secondary battery module according to claim 1, wherein the cartridge assembly further includes an upper cover and a lower cover coupled to cartridges at both ends thereof by means of hooking.

12. A method for welding electrode leads of a compact secondary battery module, comprising:

preparing a plurality of cartridges configured to accommodate a plurality of cells, respectively, and a sensing housing having a plurality of bus bars arranged at a side of a cartridge assembly in which the cartridges are stacked, each cartridge having a battery cell therein, and an electrode lead of each battery cell extending from a respective cartridge;

stacking the plurality of cartridges in a first direction to form a cartridge assembly;

bending corresponding electrode leads of adjacent cells; and arranging the corresponding electrode leads of adjacent cells to be coplanar in a first plane and one of the plurality of bus bars in a second plane overlapping the electrode leads and then welding the bus bar to the electrode leads at two welding points, the second plane being parallel to the first plane, wherein the corresponding electrode leads of adjacent cells are spaced from one another in the first direction.

13. The method for welding electrode leads of a compact secondary battery module according to claim 12, further comprising forming a barrier at a side of each cartridge.

14. The method for welding electrode leads of a compact secondary battery module according to claim 12, further comprising bending each lead at a right angle at about 1 mm from a lead insulation portion of the cell in a state of being accommodated in the corresponding cartridge.

15. The method for welding electrode leads of a compact secondary battery module according to claim 12, wherein the welding uses a laser welder.

16. The method for welding electrode leads of a compact secondary battery module according to claim 15, wherein a laser irradiation direction of the laser welder is substantially perpendicular to the sensing housing.

17. The compact secondary battery module according to claim 1, wherein the first lead and the second do not overlap in a second direction, the second direction being in the first plane and perpendicular to the first direction.

18. The method for welding electrode leads of a compact secondary battery module according to claim 12, wherein the first lead and the second do not overlap in a second direction, the second direction being in the first plane and perpendicular to the first direction.

* * * * *